United States Patent
Song

(10) Patent No.: US 11,271,564 B2
(45) Date of Patent: Mar. 8, 2022

(54) HIGH-SENSITIVITY CAPACITIVE SENSOR CIRCUIT

(71) Applicant: Chung Dam Song, Seoul (KR)

(72) Inventor: Chung Dam Song, Seoul (KR)

(*) Notice: Subject to any disclaimer, the term of this patent is extended or adjusted under 35 U.S.C. 154(b) by 27 days.

(21) Appl. No.: 16/635,888

(22) PCT Filed: Apr. 18, 2018

(86) PCT No.: PCT/KR2018/004480
§ 371 (c)(1),
(2) Date: Jan. 31, 2020

(87) PCT Pub. No.: WO2019/027124
PCT Pub. Date: Feb. 7, 2019

(65) Prior Publication Data
US 2021/0036703 A1 Feb. 4, 2021

(30) Foreign Application Priority Data
Aug. 1, 2017 (KR) .......................... 10-2017-0097699

(51) Int. Cl.
*G01R 15/20* (2006.01)
*H03K 17/955* (2006.01)

(52) U.S. Cl.
CPC ................................. *H03K 17/955* (2013.01)

(58) Field of Classification Search
CPC ....... H03K 17/955; H03K 2217/96073; H03K 2217/960705; H03K 2217/960745; H03K 2017/9455
See application file for complete search history.

(56) References Cited

U.S. PATENT DOCUMENTS

| 6,456,198 B1 | 9/2002 | Kato et al. |
| 2010/0292945 A1* | 11/2010 | Reynolds ........... G01R 27/2605 702/65 |

(Continued)

FOREIGN PATENT DOCUMENTS

| JP | 07-060185 B2 | 6/1995 |
| KR | 10-2010-0100773 A | 9/2010 |

(Continued)

OTHER PUBLICATIONS

International Search Report and Written Opinion issued in counterpart PCT application No. PCT/KR2018/004480, dated Jul. 25, 2018, 8 pp.

*Primary Examiner* — Dominic E Hawkins
(74) *Attorney, Agent, or Firm* — Kaplan Breyer Schwarz, LLP

(57) ABSTRACT

A high-sensitivity capacitive sensor circuit having improved sensitivity by implementing a plurality of detection units using charging and discharging, has: an oscillation unit for generating a control clock; a first charge/discharge unit connected to a sensing unit electrode, which generates a sensing signal while being charged/discharged according to the control clock; a second charge/discharge unit connected in parallel to the first charge/discharge unit, which generates a reference signal while being charged/discharged according to the control clock; and a detection unit for detecting a change in the capacitance on the side of the sensing unit electrode by comparing the sensing signal from the first charge/discharge unit with the reference signal from the second charge/discharge unit. The first charge/discharge unit includes: a first capacitor connected at one end thereof to the sensing unit electrode, which is charged/discharged according to the control clock; a first constant-current source for supplying a predetermined amount of constant-current to the first capacitor, which charges the first capacitor; and a first (Continued)

switch for controlling the first capacitor such that, according to the control clock, the first capacitor is repetitively charged and discharged every half cycle of the clock. The second charge/discharge unit includes: a second capacitor which is charged/discharged according to the control clock; a second constant-current source for supplying a predetermined amount of constant-current to the second capacitor so as to charge the second capacitor; and a second switch for controlling the second capacitor such that, according to the control clock, the second capacitor is repetitively charged and discharged every half cycle of the clock.

5 Claims, 3 Drawing Sheets

(56) References Cited

U.S. PATENT DOCUMENTS

| | | | | |
|---|---|---|---|---|
| 2013/0038364 A1* | 2/2013 | Tokairin | ............ | H03L 7/099 |
| | | | | 327/156 |
| 2013/0207677 A1* | 8/2013 | Togura | ............ | G01R 27/2605 |
| | | | | 324/685 |
| 2015/0168460 A1* | 6/2015 | Kim | ............ | H03K 5/2481 |
| | | | | 327/77 |
| 2015/0261351 A1* | 9/2015 | Hung | ............ | G06F 3/0418 |
| | | | | 345/174 |
| 2017/0293375 A1* | 10/2017 | Cholasta | ............ | G06F 3/044 |

FOREIGN PATENT DOCUMENTS

| | | |
|---|---|---|
| KR | 10-1046666 B1 | 7/2011 |
| KR | 10-2011-0134886 A | 12/2011 |

* cited by examiner

[Fig 1]
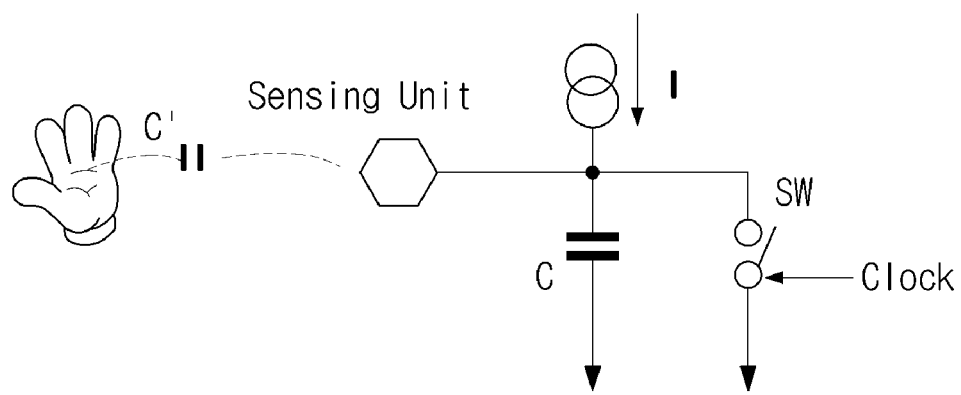
[Fig 2]
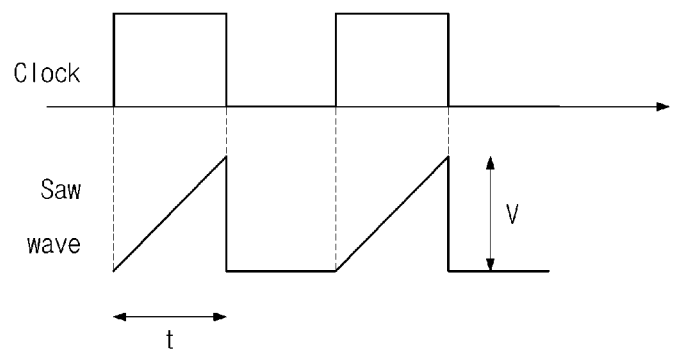

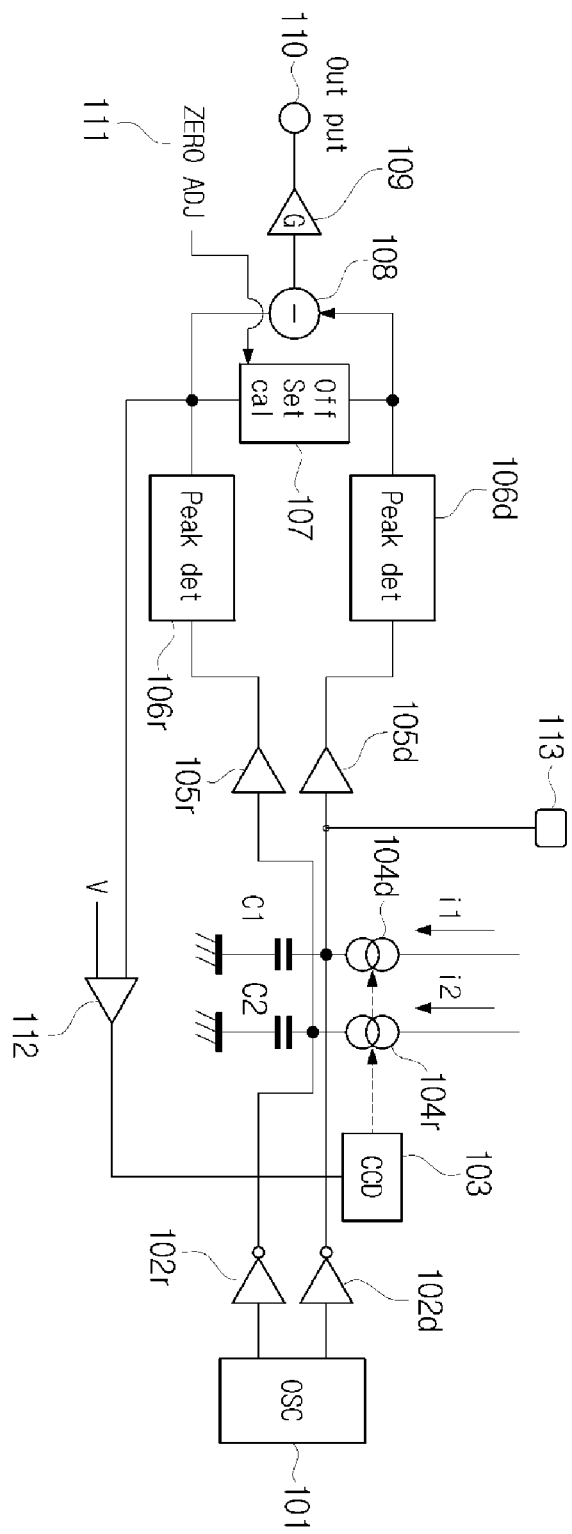
[Fig 3]

[Fig 4]
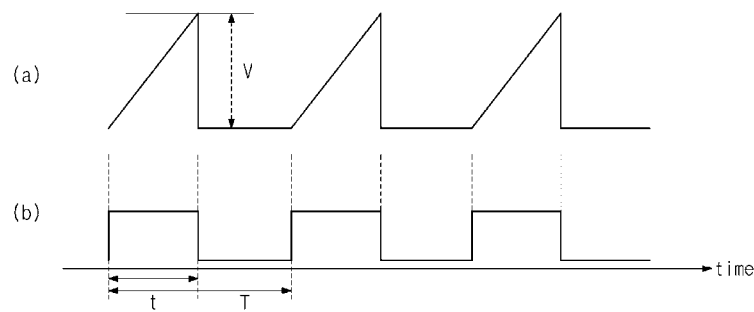
[Fig 5]
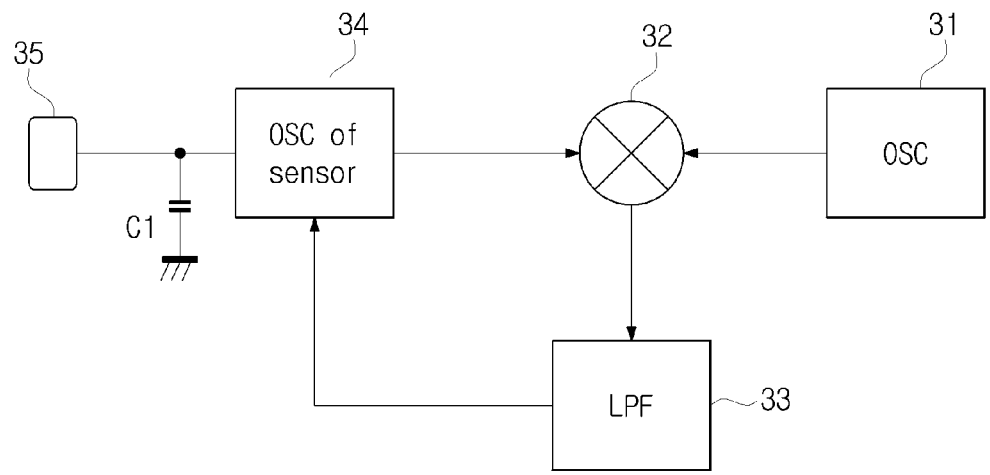

HIGH-SENSITIVITY CAPACITIVE SENSOR CIRCUIT

FIELD

The present invention relates to a capacitive sensor for detecting a capacitance, which is generated due to the proximity of an object, by a proximity sensor or the like, and more particularly, a high-sensitivity capacitive sensor circuit, in which a plurality of detection circuits using charging and discharging of a capacitor are provided, one of the detection circuits is used for a reference voltage, and a peak of a sensing signal is detected, thereby improving detection sensitivity.

BACKGROUND

In general, a proximity sensor is a sensor capable of detecting the proximity of an object to be detected in a non-contact manner, and is classified into a high-frequency oscillation type using electromagnetic induction according to a detection method, a capacitive type for sensing a change in capacitance between an object to be detected and a sensor, and a magnetic type using a magnet. In addition, a proximity sensor may be classified into a shield type (embedded type) and an unshielded type (protrusion type) according to a structure of a sensing head or classified into a DC 2-wire type, a DC 3-wire type (NPN, PNP), an AC contactless type, etc. according to an output circuit.

A high-frequency oscillation type proximity sensor generates a high-frequency magnetic field through a sensing coil at a front end of the proximity sensor, and detects a reduction or stopping of oscillation due to an overcurrent caused by an induced magnetic field generated in a metal due to electromagnetic induction when an object to be detected approaches a magnetic field. A capacitive proximity sensor includes an induction electrode of a sensing unit, and detects a large change in capacitance between the induction electrode of the sensing unit and the ground when an object approaches the induction electrode. The capacitive type proximity sensor has a fast response rate and is capable of detecting objects other than metals and thus has been widely used in industrial fields.

'Capacitance Detection Proximity Sensor' which is a capacitive proximity sensor of the related art is disclosed in registered Patent No. 10-1046666 published in Registered Patent Publication B1. The proximity sensor includes a first sensing electrode and a second sensing electrode which are arranged spaced a certain distance from each other in a detection direction in which an object to be detected approaches and operate independently from a ground potential, and a proximity detection circuit that outputs, as a proximity detection output, the difference between a ground capacitance formed by the first sensing electrode and a ground capacitance formed by the second sensing electrode; and is configured to limit a proximity detection range to an open area and reduce erroneous operations.

In 'Capacitive Proximity Sensor and Proximity Detection Method' disclosed in Korean Patent Application No. 10-2010-0100773 published in Laid-Open Patent Publication A, a sensing unit includes a sensor electrode, a shield electrode, and an auxiliary electrode, the sensor electrode is connected to a capacitance-to-voltage (C-V) conversion circuit, the shield electrode is connected to a shield driving circuit, and the auxiliary electrode is connected to the C-V conversion circuit or the shield driving circuit through a changeover switch.

In the capacitive proximity sensor of the related art, a detection circuit configured to detect a change in capacitance is more likely to be influenced by noise when an amplification degree is increased and thus it is difficult to implement a high-sensitivity capacitive sensor. For example, as illustrated in FIG. 5, a capacitive sensor circuit of the related art includes an oscillator 31, a mixer 32, a low-pass filter (LPF) 33, and an oscillation sensor 34 for detecting a capacitance sensed by a sensing unit connected thereto via a sensing unit electrode 35 and a capacitance of a capacitor C1, and detects a change in capacitance on the basis of a change in oscillation frequency of the oscillation sensor 34 caused by a change in capacitance of the sensing unit. Referring to FIG. 5, in the capacitive sensor circuit of the related art, when an oscillation signal from the oscillation sensor 34 and an oscillation signal from the oscillator 31 are input to the mixer 32, a difference signal among the sum of and a difference signal between two signals output from the mixer 32 is low-pass filtered by the LPF 3 to detect a change in capacitance.

However, when capacitance-to-voltage conversion is performed based on a change in frequency as described above, a reference voltage changes due to circuit imbalance and characteristics change over temperature, thereby making it difficult to implement a high-sensitivity capacitive sensor. That is, in the related art, when an amplification degree is increased to increase sensitivity, noise increases and thus an erroneous operation is likely to occur.

SUMMARY

Technical Problem

To address the above-described problem, the present invention is directed to providing a high-sensitivity capacitive sensor circuit in which a plurality of detection circuits using charging/discharging of a capacitor are provided, one of the detection circuits is used for a reference voltage and a peak of a sensing signal is detected, thereby improving detection sensitivity.

Technical Solution

According to one aspect of the present invention, a high-sensitivity capacitive sensor circuit includes an oscillator configured to generate a control clock; a first charge and discharge unit connected to a sensing unit electrode (a terminal of a sensor for sensing a capacitance of an object) and configured to generate a sensing signal while being charged or discharged according to the control clock; a second charge and discharge unit connected in parallel to the first charge and discharge unit and configured to generate a reference signal while being charged or discharged according to the control clock; and a sensor configured to detect a change in capacitance at the sensing unit electrode by comparing the sensing signal from the first charge and discharge unit with the reference signal from the second charge and discharge unit.

The first charge and discharge unit may include a first capacitor configured to be charged or discharged according to the control clock, wherein the sensing unit electrode is connected to one end of the first capacitor; a first constant-current source configured to supply a constant current having a certain magnitude to the first capacitor so as to charge the first capacitor; and a first switch configured to control the first capacitor to be repeatedly charged and discharged every half clock cycle according to the control clock.

The second charge and discharge unit may include a second capacitor configured to be charged or discharged according to the control clock; a second constant-current source configured to supply a constant current having a certain magnitude to the second capacitor so as to charge the second capacitor; and a second switch configured to control the second capacitor to be repeatedly charged and discharged every half clock cycle according to the control clock.

The first constant-current source and the second constant-current source may supply constant currents having the same magnitude, and the constant currents may be generated through a constant current drive.

The sensor may include a first peak sensor configured to detect a peak value of the sensing signal from the first charge and discharge unit; a second peak sensor configured to detect a peak value of the reference signal from the second charge and discharge unit; a subtractor configured to calculate the difference between the peak values through subtraction between an output of the first peak sensor and an output of the second peak sensor; and an amplifier configured to amplify an output of the subtractor.

Advantageous Effects

In a capacitive sensor circuit according to the present invention, two detection circuits using charging/discharging of a capacitor are provided, one of the detection circuits is used for a reference voltage and a peak of a sensing signal is detected to overcome the influence of noise, thereby improving detection sensitivity to be at least several times that of the related art.

In addition, according to the present invention, the linearity of a sensing signal can be improved, the influence of temperature can be minimized, and a detection distance can be increased up to 300 mm depending on the application.

BRIEF DESCRIPTION OF THE DRAWINGS

FIG. 1 is a schematic diagram illustrating the concept of capacitance detection using charging and discharging according to an embodiment of the present invention, FIG. 2 is a waveform diagram of a clock and a sensing signal illustrated in FIG. 1, FIG. 3 is a block diagram of a capacitive sensor circuit according to an embodiment of the present invention, FIG. 4 is an operational waveform diagram of a capacitive sensor circuit according to an embodiment of the present invention, and FIG. 5 is a schematic diagram of a general capacitive sensor circuit.

DETAILED DESCRIPTION

Aspects of the present invention achieved by implementing embodiments of the present invention will be more apparent from the embodiments described below. These embodiments are only examples provided to explain the present invention and are not intended to limit the scope of the present invention.

FIG. 1 is a schematic diagram illustrating the concept of capacitance detection using charging and discharging according to an embodiment of the present invention. FIG. 2 is a waveform diagram of a clock and a sensing signal illustrated in FIG. 1.

As illustrated in FIG. 1, in the concept of capacitance detection using charging and discharging according to an embodiment of the present invention, a switch SW turned on/off by a clock is connected in parallel to a charge/discharge capacitor C and a constant-current source I is connected in series to the capacitor C, and thus, the capacitor C is charged with current I flowing from the constant-current source I when the switch SW is off and is discharged when the switch SW is on. In this case, a sensing unit is connected to one end of the charge/discharge capacitor C and detects a change in capacitance by detecting a charge in charging waveform of the capacitor C due to a sensed capacitance C' formed between an object to be detected and the sensing unit.

As illustrated in FIG. 2, a clock for control of charging and discharging of the capacitor C is a square wave having a certain cycle and a voltage charged in the capacitor C is a saw tooth wave having a certain cycle and a peak voltage V. Referring to FIG. 2, a sawtooth wave is generated as the capacitor C is charged every square-wave half cycle t.

Referring to FIGS. 1 and 2, a charging voltage V is calculated by dividing the quantity of electric charge It for a time t by a capacitance of the capacitor C as shown in Equation 1, and the time t is half a cycle of the clock.

$$V = \frac{1}{C} It \qquad \text{[Equation 1]}$$

For example, when a peak value is 2.5 V and a clock frequency is 100 Khz, a constant current I is calculated to be 5 μA according to Equation 1 above. When a detected capacitance C' generated by a hand or the like is 1 pF, a peak voltage V' is calculated to be approximately 2.27 V according to Equation 2 below.

$$V' = \frac{1}{C + C'} It \qquad \text{[Equation 2]}$$

Therefore, in an example of the circuit described above, a change rate is calculated to be (1−2.27/2.5), i.e., approximately 9.2%. To increase actual detection sensitivity, it is necessary to increase a peak voltage and reduce a capacity of a capacitor.

FIG. 3 is a block diagram of a capacitive sensor circuit according to an embodiment of the present invention. FIG. 4 is an operational waveform diagram of a capacitive sensor circuit according to an embodiment of the present invention.

A capacitive sensor circuit according to an embodiment of the present invention includes an oscillator for generating a control clock, a first charge and discharge unit connected to a sensing unit electrode and configured to generate a sensing signal while being charged or discharged according to the control clock, a second charge and discharge unit connected in parallel to the first charge and discharge unit and configured to generate a reference signal while being charged or discharged according to the control clock, and a sensor configured to detect a change in capacitance at the sensing unit electrode by comparing the sensing signal from the first charge and discharge unit with the reference signal from the second charge and discharge unit.

As illustrated in FIG. 3, a capacitive sensor circuit according to an embodiment includes a first capacitor C1, a second capacitor C2, an oscillator 101, a first switch 102d, a second switch 102r, a constant-current drive 103, a first constant-current source 104d, a second constant-current source 104r, a first buffer 105d, a second buffer 105r, a first peak sensor 106d, a second peak sensor 106r, an offset adjuster 107, a subtractor 108, an amplifier 109, an output terminal 110, an offset coordinator 111, a comparator 112, and a sensing unit electrode 113. The oscillator may be embodied as the oscillator 101. The first charge and discharge unit may be embodied as the first capacitor C1, the first switch 102d, and the first constant-current source 104d. The second charge and discharge unit may be embodied as the second capacitor C2, the second switch 102r, and the second constant-current source 104r. The sensor may be embodied as the first peak sensor 106d, the second peak sensor 106r, the subtractor 108, and the amplifier 109.

Referring to FIG. 3, the oscillator 101 generates a square-wave pulse clock having a cycle T (a half cycle t), as illustrated in FIG. 4 (b), and provides the square-wave pulse clock to both the first switch 102d and the second switch 102r.

One end of the first capacitor C1 is connected to the sensing unit electrode 113, the first constant-current source 104d, and the first switch 102d, and the other end is connected to a ground voltage GND source. As illustrated in FIG. 4, the first switch 102d is turned off for the half cycle t of the clock to charge the first capacitor C1 with current i1 from the first constant-current source 104d, thereby generating a sawtooth wave, and is turned on for another half cycle of the clock to discharge the first capacitor C1.

One end of the second capacitor C2 is connected to the second constant-current source 104r and the second switch 102r and the other end is connected to the ground voltage GND source. As illustrated in FIG. 4, the second switch 102r is turned off for the half cycle t of the clock to charge the second capacitor C2 with current i2 from the second constant-current source 104r to generate a sawtooth wave, and is turned on for another half period of the clock to discharge the second capacitor C2. In this case, the constant currents i1 and i2 having the same magnitude (i.e., i1=i2) flow from the first constant-current source 104d and the second constant-current source 104r to the capacitors C1 and C2 through the same constant-current drive 103.

Referring to FIG. 4, (a) illustrates a charging voltage waveform generated by the first capacitor C1 or the second capacitor C2, and (b) illustrates a clock waveform supplied to the first switch 102d and the second switch 102r.

When no object is sensed by a sensing unit (not shown), a sensed capacitance C' at the sensing unit electrode 113 is 0, and the constant currents i1 and i2 having the same capacitance value and the same magnitude (here, i1=i2) respectively flow to the first capacitor C1 and the second capacitor C2, and therefore, charging voltages V are charged with the same constant current for a half cycle of a clock and thus have the same value. That is, a charging voltage of the second capacitor C2 acts as a reference voltage and a charging voltage of the first capacitor C1 acts as a sensing voltage. When no object is sensed by the sensing unit, C'=0 and thus C2=C1 and i1=i2. Therefore, the charging voltage of the first capacitor C1 and the charging voltage of the second capacitor C2 are calculated to be the same according to Equation 1 above and thus the sensing voltage and the reference voltage are the same. When the sensing voltage and the reference voltage are different from each other due to a characteristic deviation of a circuit element although no object is sensed by the sensing unit, the offset adjuster 107 is controlled by the offset coordinator 111 to perform calibration such that detection values are the same (i.e., the difference between the detection values is zero).

On the other hand, when an object is sensed by the sensing unit, the sensed capacitance C' of the sensing unit is connected through the sensing unit electrode 113 and is connected in parallel to the first capacitor C1, thereby increasing the total capacitance of the first charge and discharge unit. Therefore, a charging voltage V' when the object is sensed may be calculated using Equation 2 above, and is lower than a charging voltage of the second capacitor C2 and thus the object may be sensed according to the difference (V−V'=ΔV) between the charging voltage V' and the charging voltage V.

Referring back to FIG. 3, the first buffer 105d buffers a charging voltage (i.e., a sensing voltage) of the first charge and discharge unit and transmits the buffered voltage to the first peak sensor 106d, and the second buffer 105r buffers a charging voltage (i.e., a reference voltage) of the second charge and discharge unit and transmits the buffered voltage to the second peak sensor 106r.

The first peak sensor 106d detects a peak value of the sensing voltage, the second peak sensor 106r detects a peak value of the reference voltage, and the subtractor 108 calculates the difference between the peak value of the reference voltage and the peak value of the sensing voltage and outputs the difference to the amplifier 109. The amplifier 109 amplifies the output of the subtractor 108 and outputs the amplified output to the outside via the output terminal 110.

As described above, the offset adjuster 107 is controlled by the offset coordinator 111 to calibrate an offset such that an output signal of the first charge and discharge unit and an output signal of the second charge and discharge unit are the same in a state in which the object is not detected.

The comparator 112 compares a peak value of the reference voltage with a set voltage V so that the constant currents i1 and i2 may flow through the first capacitor C1 and the second capacitor C2 for only a half cycle (a charge period) of a clock, and controls the constant-current drive 103 to prevent the constant currents i1 and i2 from flowing through the first capacitor C1 and the second capacitor C2 for a discharge period.

In an embodiment of the present invention, the same current is supplied to constant-current circuits of two sensors (charge and discharge units) so that directions of current noise may be the same. Therefore, the influence of the current noise may be reduced through comparison (subtraction) between the reference voltage and the sensing voltage, and drift and the like may be eliminated similarly.

While the present invention has been described above with reference to one embodiment illustrated in the drawings, it will be understood by those of ordinary skill in the art that various modifications may be made therein and equivalent other embodiments are possible.

The invention claimed is:

1. A high-sensitivity capacitive sensor circuit comprising:
an oscillator configured to generate a control clock;
a first charge and discharge unit connected to a sensing unit electrode and configured to generate a sensing signal while being charged or discharged according to the control clock;
a second charge and discharge unit connected in parallel to the first charge and discharge unit and configured to generate a reference signal while being charged or discharged according to the control clock; and
a sensor configured to detect a change in capacitance at the sensing unit electrode by comparing the sensing signal from the first charge and discharge unit with the reference signal from the second charge and discharge unit, wherein the sensor comprises:

a first peak sensor configured to detect a peak value of the sensing signal from the first charge and discharge unit;

a second peak sensor configured to detect a peak value of the reference signal from the second charge and discharge unit;

a subtractor configured to calculate the difference between the peak values through subtraction between an output of the first peak sensor and an output of the second peak sensor; and an amplifier configured to amplify an output of the subtractor.

2. The high-sensitivity capacitive sensor circuit of claim 1, wherein the first charge and discharge unit comprises:

a first capacitor, one end of which is connected to the sensing unit electrode and which is charged or discharged according to the control clock; a first constant-current source configured to supply a constant current having a certain magnitude to the first capacitor so as to charge the first capacitor; and a first switch configured to control the first capacitor to be repeatedly charged and discharged every half clock cycle according to the control clock.

3. The high-sensitivity capacitive sensor circuit of claim 2, wherein the first constant-current source and the second constant-current source supply constant currents having the same magnitude, wherein the constant currents are generated by a constant current drive.

4. The high-sensitivity capacitive sensor circuit of claim 1, wherein the second charge and discharge unit comprises:

a second capacitor configured to be charged or discharged according to the control clock, a second constant-current source configured to supply a constant current having a certain magnitude to the second capacitor so as to charge the second capacitor; and a second switch configured to control the second capacitor to be repeatedly charged and discharged every half clock cycle according to the control clock.

5. The high-sensitivity capacitive sensor circuit of claim 4, wherein the first constant-current source and the second constant-current source supply constant currents having the same magnitude, wherein the constant currents are generated by a constant current drive.

\* \* \* \* \*